United States Patent
Hynecek

(10) Patent No.: US 9,456,159 B1
(45) Date of Patent: Sep. 27, 2016

(54) PIXELS WITH AN ACTIVE RESET CIRCUIT IN CMOS IMAGE SENSORS

(71) Applicant: SEMICONDUCTOR COMPONENTS INDUSTRIES, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/862,830

(22) Filed: Sep. 23, 2015

(51) Int. Cl.
| H04N 5/374 | (2011.01) |
| H04N 5/363 | (2011.01) |
| H04N 5/378 | (2011.01) |
| H01L 27/146 | (2006.01) |
| H04N 5/3745 | (2011.01) |

(52) U.S. Cl.
CPC .... H04N 5/37457 (2013.01); H01L 27/14609 (2013.01); H04N 5/363 (2013.01); H04N 5/378 (2013.01)

(58) Field of Classification Search
CPC .. H04N 5/37457; H04N 5/363; H04N 5/357; H04N 5/378; H04N 5/374; H01L 27/14609
USPC ....... 348/300, 301, 241; 250/208.1; 257/292
See application file for complete search history.

(56) References Cited

U.S. PATENT DOCUMENTS

| 5,625,210 | A | 4/1997 | Lee et al. | |
| 6,777,660 | B1* | 8/2004 | Lee | H01L 27/14609 250/208.1 |
| 6,917,027 | B2 | 7/2005 | Krymski | |
| 2002/0093034 | A1 | 7/2002 | Hynecek | |
| 2003/0034434 | A1* | 2/2003 | Simony | H04N 5/363 250/208.1 |
| 2005/0040320 | A1* | 2/2005 | Lule | H01L 27/14609 348/E3.021 |
| 2005/0057675 | A1* | 3/2005 | Lee | H04N 5/363 348/308 |
| 2006/0001752 | A1 | 1/2006 | Yanagisawa et al. | |
| 2007/0188639 | A1* | 8/2007 | Koifman | H04N 5/363 348/301 |
| 2007/0262238 | A1* | 11/2007 | Takashima | H04N 3/155 250/208.1 |
| 2008/0210986 | A1 | 9/2008 | Mauritzson | |

(Continued)

OTHER PUBLICATIONS

Yasutomi et al., "A 2.7e Temporal Noise 99.7% Shutter Efficiency 92 dB Dynamic Range CMOS Image Sensor with Dual Global Shutter Pixels." ISSCC Digest of Technical Papers (Feb. 10, 2010), pp. 398-399.

(Continued)

Primary Examiner — Nhan T Tran
(74) Attorney, Agent, or Firm — Treyz Law Group, P.C.; Joseph F. Guihan

(57) ABSTRACT

The invention disclosure describes pixels arranged into CMOS image sensor arrays that may be back side illuminated and may operate in a global shutter mode. The image sensor pixels may also be front side illuminated. The pixel charge storage sites for the global shutter operation are formed by floating diffusions that are small and do not collect a significant number of stray charge, which contributes to the sensor's high shutter efficiency. The floating diffusions are reset by an active reset circuit that significantly reduces generation of kTC reset noise. The active reset circuit consists of an in-pixel inverting amplifier formed by a p-channel gain transistor with an n-channel transistor load, and a feedback reset transistor connected from the amplifier output to the amplifier input, which is the FD node. The active reset circuit does not utilize a significant portion of the pixel area and has low power consumption.

20 Claims, 3 Drawing Sheets

(56) References Cited

U.S. PATENT DOCUMENTS

| | | | |
|---|---|---|---|
| 2014/0002701 A1* | 1/2014 | Koifman | H04N 5/363 348/294 |
| 2014/0085523 A1* | 3/2014 | Hynecek | H04N 5/235 257/292 |
| 2015/0256777 A1* | 9/2015 | Ishii | H04N 5/378 250/208.1 |

OTHER PUBLICATIONS

Fowler et al., "Low-noise readout using active reset for CMOS APS." Proc. SPIE 3965, Sensors and Camera Systems for Scientific, Industrial, and Digital Photography Applications, 126 (May 15, 2000).

\* cited by examiner ically, a Source Follower (SF),
PIXELS WITH AN ACTIVE RESET CIRCUIT IN CMOS IMAGE SENSORS

BACKGROUND

This relates to image sensors and, more particularly, to solid-state image sensor arrays that incorporate pixels with an active reset.

Modern electronic devices such as cellular telephones, cameras, and computers often use digital image sensors. Image sensors (sometimes referred to as imagers) may be formed from a two-dimensional array of image sensing pixels. Each pixel includes a photosensitive region that receives incident photons (light) and converts the photons into electrical signals. Image sensors are sometimes designed to provide images to electronic devices using a Joint Photographic Experts Group (JPEG) format.

Image sensors may sense light by converting impinging photons into electrons or holes that are integrated (collected) in sensor pixels. After completion of an integration cycle, collected charge is converted into a voltage, which is then supplied to the output terminals of the sensor. After charge to voltage conversion is completed and the resulting signal transferred out from the pixels, the pixels may be reset in order to be ready for accumulation of new charge. However, resetting the pixels may generate kTC reset noise.

It would therefore be desirable to provide improved pixels with minimized pixel kTC reset noise.

DETAILED DESCRIPTION

Image sensors may sense light by converting impinging photons into electrons or holes that are integrated (collected) in sensor pixels. After completion of an integration cycle, collected charge is converted into a voltage, which is then supplied to the output terminals of the sensor. In complementary metal-oxide semiconductor (CMOS) image sensors, the charge to voltage conversion is accomplished directly in the pixels themselves and the analog pixel voltage is transferred to the output terminals through various pixel addressing and scanning schemes. The analog signal may also be converted on-chip to a digital equivalent before reaching the chip output. The pixels may have an incorporated buffer amplifier, typically a Source Follower (SF), which drives the sense lines that are connected to the pixels with suitable addressing transistors.

After charge to voltage conversion is completed and the resulting signal transferred out from the pixels, the pixels are reset in order to be ready for accumulation of new charge. In pixels that use a Floating Diffusion (FD) as the charge detection node, the reset is accomplished by turning on a reset transistor that conductively connects the FD node to a voltage reference, which is typically the SF drain node. This step removes collected charge; however, it generates kTC-reset noise. This kTC-reset noise may be removed from the signal by the Correlated Double Sampling (CDS) signal processing technique in order to achieve the desired low noise performance. The CMOS image sensors that utilize the CDS concept may include three transistors (3T) or four transistors (4T) in the pixel, one of which serves as the charge transferring (TX) transistor. It is possible to share some of the pixel circuit transistors among several photodiodes, which also reduces the pixel size.

Figure 1:
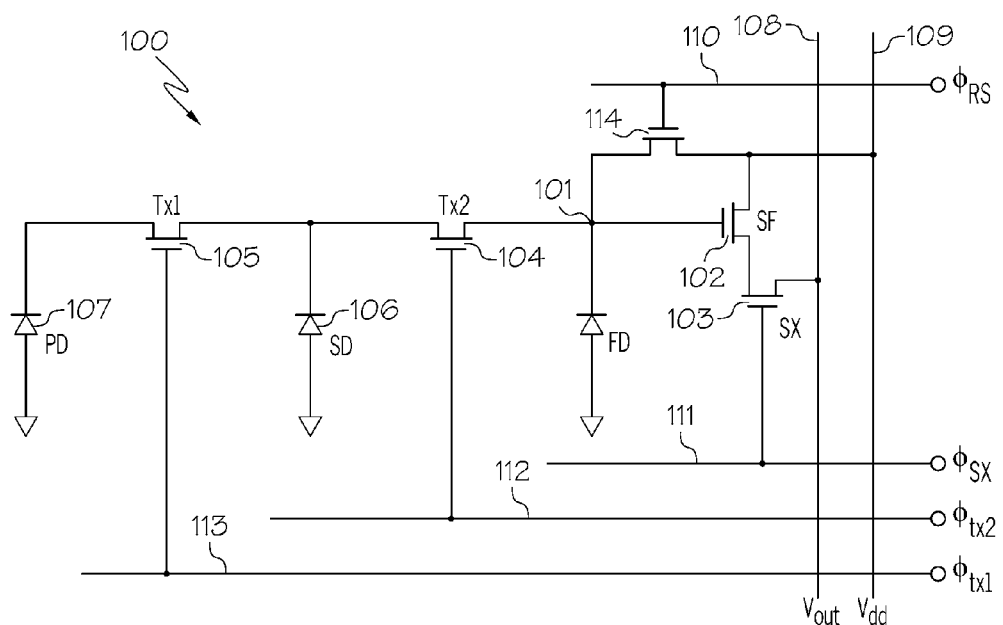
FIG. 1 is a circuit diagram of an exemplary pixel that is used in a global shutter sensor.

In image sensors that are designed to operate in a global shutter (GS) mode, a second storage diode may be added into the pixel. A simplified circuit diagram 100 of pixels with a storage diode that are used in a global shutter sensor is shown in FIG. 1. Diagram 100 represents the simplified schematic diagram of a global shutter pixel with pinned photodiode 107 (PD) coupled through charge transferring transistor 105 (Tx1) to charge storage pinned diode 106 (SD). The impinging light generated charge from photodiode 107 in a sensor array may be transferred to storage diode 106 globally for all of the pixels at the same time. The readout of charge from the diode 106 then proceeds in a sequential manner row by row by transferring charge via charge transferring transistor 104 (Tx2) to Floating Diffusion charge detection node 101. The transferred charge causes the potential on this node to change and this change is sensed by the Source Follower transistor 102. The source of SF transistor 102 is connected via addressing transistor 103 (SX) to the sensor array column sensing lines 108 that deliver the pixel signal ($V_{out}$) to the periphery of the array for further processing. After charge sensing has been completed the FD node 101 is reset by momentarily turning on the reset transistor 114 (RS). However, this type of reset may cause kTC reset noise generation on this node. Therefore, it may be necessary to use the CDS signal readout technique to minimize its deleterious effects on the signal. The CDS charge detection scheme consists of reading the potential on the node 101 prior to charge transfer and then again after the charge transfer. These two values are then subtracted from each other by the circuits located at the periphery of the array resulting in the signal without kTC reset noise. The pixel controlling signals ($\phi_{RS}$, $\phi_{SX}$, $\phi_{tx1}$, and $\phi_{tx2}$) may be delivered to the gates of the corresponding transistors by the lines 110, 111, 112 and 113 respectively from the periphery of the array where the corresponding driver circuits are located. The power is supplied to the pixels by the column Vdd bus line 109.

To implement this concept, the pixel size needs to be increased by incorporating the pixel area consuming charge storage diode 106 into every pixel. This may increase the size of the image sensor. Another possible disadvantage of this concept is the problem of insufficient light shielding of diode 106 when used in Back Side Illumination (BSI) applications. This may result in poor pixel shutter efficiency.

Figure 2:
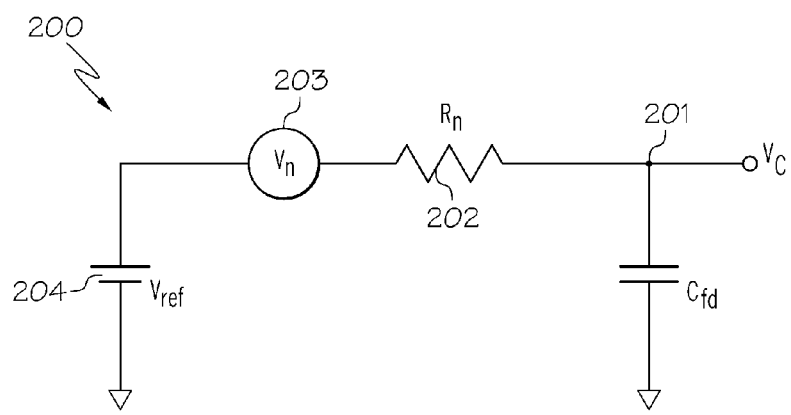
FIG. 2 is an equivalent circuit diagram that illustrates the generation of kTC reset noise during the reset of a Floating Diffusion node in the pixel of FIG. 1.

FIG. 2 shows a simplified circuit diagram 200 that illustrates the generation of kTC reset noise during the reset of FD node 101. In this diagram, reset transistor 114 is represented by resistor 202. A corresponding noise voltage generated by this resistor is represented by voltage source 203. The FD node is represented by its equivalent capacitance 201 ($C_{fd}$), which should be reset to voltage reference 204. However, due to noise generated in the resistor, the reset voltage on the capacitor Cfd is never equal to the reference voltage 204 but includes a random error voltage that is different every time this node is reset. The square of the root mean squared (RMS) value of this reset error is calculated by integrating the resistor noise power spectral density over the entire frequency spectrum as follows:

$$<v_n^2> = \frac{2kTR_n}{\pi} \int_0^\infty \frac{d\omega}{1+(\omega R_n C_{fd})^2} = \frac{kT}{C_{fd}} \quad (1)$$

The result is the kTC reset noise formula written in terms of noise voltage. In this formula, $C_{fd}$ is the equivalent capacitance of the floating diffusion region, T is absolute temperature, k is Boltzmann's constant, $R_n$ is resistance, $\omega$ is angular frequency, and $<v_n^2>$ is the square of the root mean squared value called voltage variance. One point to note in this formula is that the result does not depend on the value of the resistance $R_n$. When converted to equivalent charge generated on this node by the reset, the result becomes the kTC noise formula:

$$<Q_n> = \sqrt{kTC_{fd}} \quad (2)$$

In this formula, $<Q_n>$ is the equivalent charge RMS noise, k is Boltzmann's constant, T is absolute temperature, and $C_{fd}$ is the equivalent capacitance of the floating diffusion region. To eliminate this reset noise from the signal it is, therefore, necessary to read the voltage on the FD node twice, once before charge transfer and the second time after charge transfer as previously mentioned. This is the essence of the CDS readout scheme. However, in addition to longer readout times and additional power consumption it also may be necessary to design signal storing and subtraction circuits at the periphery of the array that have low noise, because signal subtraction may potentially also increase noise.

Figure 3:
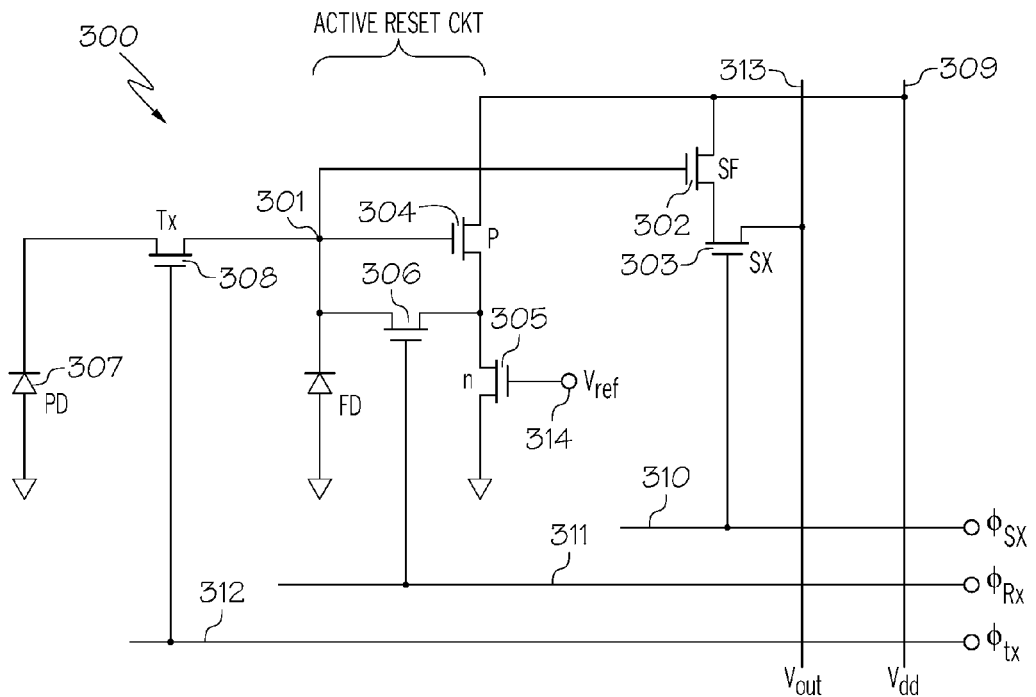
FIG. 3 is a circuit diagram of a pixel with global shutter capability and an active reset circuit in accordance with an embodiment of the present invention.

The pixel circuit shown in FIG. 3 decreases the size of the image sensor array compared to the pixel of FIG. 1 by using an in-pixel amplifier with a negative feedback to minimize pixel kTC reset noise. This concept has advantages in designing global shutter CMOS image sensors where charge may be stored on FD nodes and in all similar applications where charge is integrated on the FD nodes and the CDS signal reading scheme cannot be easily implemented.

Specifically, the pixel shown in FIG. 3 may be useful in applications where charge may be integrated or stored on Floating Diffusions that when reset as described in connection with FIGS. 1 and 2 would generate large kTC reset noise. The pixel of FIG. 3 utilizes another type of reset where a voltage gain amplifier with a negative feedback is integrated directly into the pixel circuit to minimize this kTC reset noise. A number of types of CMOS image sensor arrays may take advantage of this active reset concept. For example, global shutter image sensors where charge from photodiodes is simultaneously transferred on the FD nodes where it waits for a sequential scanning. Other applications for this concept are stacked chip sensors where the chip stacking is realized at the FD nodes, very small three transistor (3T) pixels with high dynamic range (HDR), medical application devices with very large pixels where charge transfer to FDs is difficult, and multilevel photodiode structures for color sensing in dependence on the depth of charge generation in the semiconductor bulk where the standard four transistor (4T) charge transfer pixel structure is difficult to implement or is not convenient to use. These examples are merely illustrative. The active reset circuit for minimized kTC reset noise may be used in any desired pixel and in any desired application.

FIG. 3 shows a simplified circuit diagram 300 of a pixel with global shutter capability and an active reset circuit (active reset ckt). Photodiode 307 (PD) collects and integrates electrons that are generated by photons impinging on the device from the back side or from the front side of the substrate. After enough charge has been accumulated in the diode, charge is transferred via the charge transferring transistor 308 onto the FD node 301 where the charge waits for scanning. Before transferring charge with transferring transistor 308 (Tx), the FD node may be reset to a certain predetermined voltage reference. The gate of SF transistor 302 is also connected to the node 301 to sense the potential change when charge is transferred onto this node. The source of the SF transistor 302 (SF) is connected via the pixel addressing transistor 303 (SX) to the sensor array column sense line 313 that delivers the sensed voltage signal ($V_{out}$) to the array periphery for further processing. The SF drain is connected to the array drain column bias line 309. The pixel row control lines 310, 311, and 312 deliver the necessary operation signals ($\phi_{SX}$, $\phi_{RX}$, and $\phi_{tx}$ respectively) to the pixels of the selected row. Line 310 may control row addressing transistor 303, line 312 may control charge transfer from the PD onto the FD, and line 311 may control the pixel resets of all pixels in the selected row. The drivers generating these operation signals are located at the array periphery.

After the voltage signal has been sensed and processed by the array peripheral circuits, the FD node 301 is reset to reestablish the predetermined voltage reference. This reset is accomplished by the active reset circuit according to the invention embodiment that consists of a p-channel transistor 304 with a constant current load formed by an n-channel transistor 305, and the reset transistor 306. P-channel transistor 304 and the constant current load 305 represent an inverting amplifier. The gate of the transistor 304 is connected to the FD node 301 and any reset voltage error appearing on that node is thus amplified and fed back inverted onto the node 301 via the reset transistor 306 acting here as a feedback resistor to compensate for this reset error. FD node 301 is thus always reset near the same predetermined reference voltage with most of kTC reset noise eliminated. After the active reset of the node 301 has been completed, the amplifier may be turned off by turning off current load transistor 305. This is accomplished by applying the appropriate signal to transistor gate 314. This step saves the sensor power.

P-channel transistor 304 may use holes for conduction, while n-channel transistor 305 may use electrons for conduction. P-channel transistor 304 may be a p-channel gain transistor, while n-channel transistor 305 may be an n-channel load transistor. P-channel gain transistor 304 may act as an amplifier by taking a relatively smaller input signal and producing a relatively larger output signal that is proportional to the input signal. N-channel transistor 305 may be coupled to a voltage reference. If n-channel transistor 305 is switched on, reset transistor 306 may be coupled to the reference voltage. After the floating diffusion region has been reset, n-channel load transistor 305 may be switched off to conserve power.

There are other variations of this invention embodiment. For example, it is possible to eliminate the SF transistor 302 from the pixel and use the transistor 304 also as an amplifier for the signal.

Figure 4:
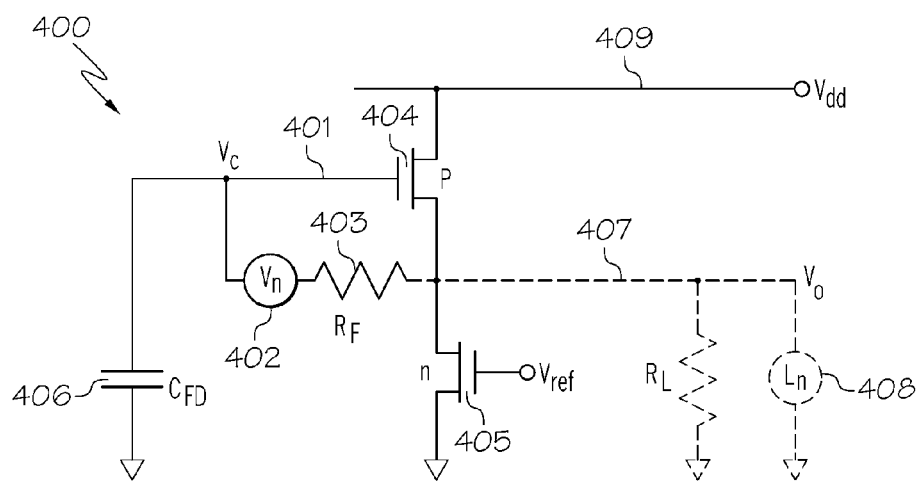
FIG. 4 is an equivalent circuit diagram that illustrates generation of kTC reset noise during the reset of a Floating Diffusion node in the pixel of FIG. 3 in accordance with an embodiment of the present invention.

The pixel arrangement of FIG. 3 has superior reset noise performance compared to the pixel of FIG. 1. The simplified equivalent circuit diagram 400 for the noise evaluation is shown in FIG. 4. In this diagram the reset transistor 306 has been replaced by a resistor 403 with an equivalent voltage noise generator 402. Reset transistor 306 may be turned off relatively slowly in order for the amplifier and the circuit feedback to have enough time to react. During this process the transistor 306 behaves as a high value resistor approaching infinity when it is eventually completely turned off. Noise generated in transistors 404 and 405 has been added to the model and is represented by the equivalent shot noise generator 408. The amplifier output impedance is represented by the load resistance RL 407. Following the similar calculations as presented previously, the result for the square of the RMS value of voltage noise on the FD node 301 when the active reset is in its final stages of completion is as follows:

$$<v_c^2> = \frac{kT}{C_{fd}}\left(\frac{1}{1+|A|} + \frac{R_L}{R_f}\right) \quad (3)$$

In this formula, A represents the gain of the active reset circuit amplifier, k is Boltzmann's constant, T is absolute temperature, $C_{fd}$ is the equivalent capacitance of the floating diffusion region, $R_f$ is the resistance of reset transistor 306, $R_L$ is the load resistance associated with the amplifier output impedance, and $<v_c^2>$ is the square of the root mean squared value known as voltage variance. Since the feedback resistance ($R_f$) becomes infinite after the reset is fully completed, the equivalent value of noise in terms of noise charge on the node 301 is as follows:

$$<Q_n> = kTC_{fd}/(1=|A|) \quad (4)$$

In this formula, A represents the gain of the active reset circuit amplifier, k is Boltzmann's constant, T is absolute temperature, $C_{fd}$ is the equivalent capacitance of the floating diffusion region, and $<Q_n>$ is the equivalent RMS noise charge. It is thus clear that depending on the in-pixel amplifier gain the active reset will significantly reduce the pixel kTC reset noise.

The main advantages of the active pixel reset described in FIGS. 3 and 4 are its simplicity, its capability of resetting charge that has been integrated or stored on the FD with minimum reset noise, and its relatively small demand for additional pixel area. This makes this concept particularly suitable for back-side illuminated (BSI) global shutter sensor applications, for stacked chip application where the chip-to-chip connections are realized at the FD nodes, and for stacked photodiodes that sense charge depending on the depth of its generation in the silicon bulk.

The pixel circuit design shown in FIG. 3 thus uses an active pixel reset that reduces reset noise directly at the FD node using an amplifier with a negative feedback. The advantages of this concept are apparent when applied to global shutter pixels because no additional large pinned diode is needed for charge storage. Charge in this case may be stored on very small FD nodes. Also, no CDS charge storage capacitors and signal subtractions are necessary, particularly when attempting to perform the CDS operation directly in the pixels themselves. However, CDS operation may still be used in sensors with the in-pixel active resets to eliminate the pixel-to-pixel reset reference variations caused by the variations in the transistor thresholds.

Figure 5:
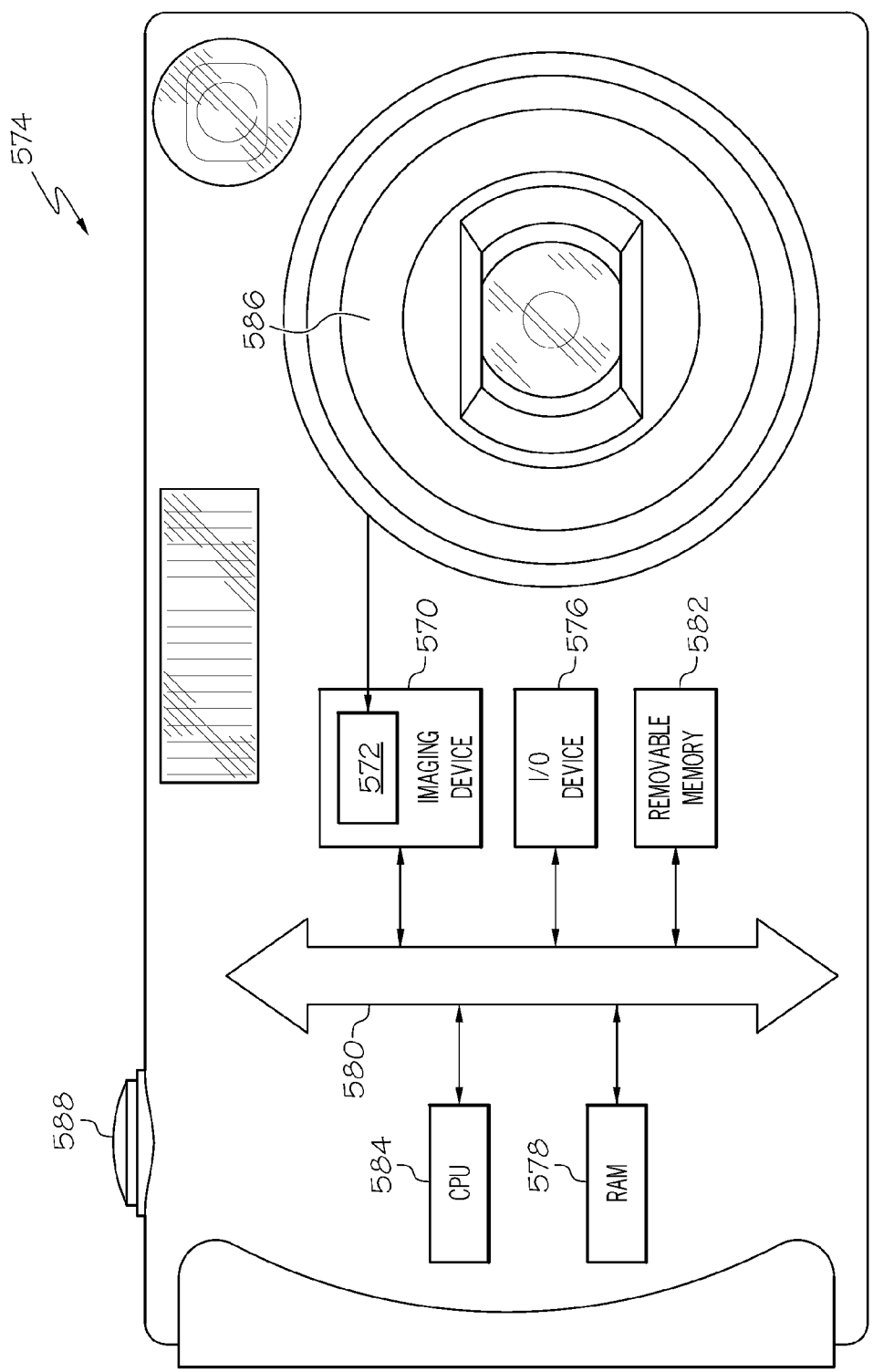
FIG. 5 is a block diagram of a system employing the embodiments of FIGS. 3 and 4 in accordance with an embodiment of the present invention.

FIG. 5 shows in simplified form a typical processor system 574 which includes an imaging device 570. Imaging device 570 may include a pixel array 572 formed on an image sensor. Pixel array 572 may include pixels such as those shown in FIG. 3. Processor system 574 is exemplary of a system having digital circuits. Without being limiting, processor system 574 may include a computer system, still or video camera system, scanner, machine vision, vehicle navigation, video phone, surveillance system, auto focus system, star tracker system, motion detection system, image stabilization system, and other systems employing an imaging device.

Processor system 574, which may be a digital still or video camera system, may include a lens such as lens 586 for focusing an image onto a pixel array such as pixel array 572 when shutter release button 588 is pressed. Processor system 574 may include a central processing unit such as central processing unit (CPU) 584. CPU 584 may be a microprocessor that controls camera functions and one or more image flow functions and communicates with one or more input/output (I/O) devices 576 over a bus such as bus 580. Imaging device 570 may also communicate with CPU 584 over bus 580. System 574 may include random access memory (RAM) 578 and removable memory 582. Removable memory 582 may include flash memory that communicates with CPU 584 over bus 580. Removable memory 582 may be stored on an external device. Although bus 580 is illustrated as a single bus, it may be one or more buses or bridges or other communication paths used to interconnect the system components.

In various embodiments of the invention, an image sensor may have a pixel array that includes an array of pixels. A pixel in the array of pixels may include a floating diffusion region, a photodiode that is coupled to the floating diffusion region, and a transfer transistor coupled between the photodiode and the floating diffusion region. The pixel may also include an active reset circuit that includes an inverting amplifier. The inverting amplifier may include a p-channel gain transistor and an n-channel load transistor. The active reset circuit may also include a reset transistor coupled between the inverting amplifier output and the floating diffusion region.

The pixel may also include a source follower transistor that is coupled to the floating diffusion region. The pixel may also include a pixel addressing transistor. The pixel may be a back-side illuminated pixel or a front-side illuminated pixel. In embodiments where the pixel is back-side illuminated, the photodiode may be formed in a substrate and a microlens and color filter may be formed on a back side of the substrate. In embodiments where the pixel is front-side illuminated, the photodiode may be formed in a substrate and a microlens and color filter may be formed on a front side of the substrate. The active reset circuit may be configured to reset the floating diffusion region to a reference voltage. The inverting amplifier may be configured to be turned off after the floating diffusion region is reset to the reference voltage. The p-channel gain transistor may be configured to amplify a signal from the floating diffusion region after the floating diffusion region is reset to the reference voltage.

In various embodiments of the invention, a system may include a central processing unit, memory, a lens, input-output circuitry, and an imaging device. The imaging device may include an array of pixels, each of which includes a floating diffusion region and an active reset circuit that includes an inverting amplifier. The inverting amplifier may include a p-channel gain transistor and an n-channel load transistor. The active reset circuit may also include a reset transistor coupled between the inverting amplifier output and the floating diffusion region.

In various embodiments of the invention, pixels may be back side illuminated and may operate in a global shutter mode. The image sensor pixels may also be front side illuminated. The pixel charge storage sites for the global shutter operation may be formed by floating diffusions that are small and do not collect a significant number of stray charge, which contributes to the sensor's high shutter efficiency. The floating diffusions are reset by an active reset circuit that significantly reduces generation of kTC reset noise. The active reset circuit may include an in-pixel inverting amplifier formed by a p-channel gain transistor with an n-channel transistor load, and a feedback reset transistor connected from the amplifier output to the amplifier input, which is the FD node.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor having a pixel array that includes an array of pixels, wherein a pixel of the array of pixels comprises:
    a floating diffusion region;
    a photodiode that is coupled to the floating diffusion region;
    a charge transfer transistor coupled between the photodiode and the floating diffusion region; and
    an active reset circuit that includes an inverting amplifier, wherein the inverting amplifier comprises a p-channel gain transistor and an n-channel load transistor, and wherein the active reset circuit further comprises a reset transistor coupled between an output of the inverting amplifier and the floating diffusion region.

2. The image sensor defined in claim 1, wherein the pixel further comprises a source follower transistor.

3. The image sensor defined in claim 2, wherein the source follower transistor is coupled to the floating diffusion region.

4. The image sensor defined in claim 2, wherein the pixel further comprises a pixel addressing transistor.

5. The image sensor defined in claim 1, wherein the pixel is a back-side illuminated pixel.

6. The image sensor defined in claim 5, wherein the photodiode is formed in a substrate, the pixel further comprising a color filter and a microlens formed on a back side of the substrate.

7. The image sensor defined in claim 1, wherein the pixel is a front-side illuminated pixel.

8. The image sensor defined in claim 7, wherein the photodiode is formed in a substrate, the pixel further comprising a color filter and a microlens formed on a front side of the substrate.

9. The image sensor defined in claim 1, wherein the active reset circuit is configured to reset the floating diffusion region to a reference voltage.

10. The image sensor defined in claim 9, wherein the inverting amplifier is configured to be turned off after the floating diffusion region is reset to the reference voltage.

11. The image sensor defined in claim 9, wherein the p-channel gain transistor is configured to amplify a signal from the floating diffusion region after the floating diffusion region is reset to the reference voltage.

12. An imaging pixel comprising:
    a floating diffusion region; and
    an active reset circuit that includes an inverting amplifier, wherein the inverting amplifier comprises a p-channel gain transistor and an n-channel load transistor, and wherein the active reset circuit further comprises a reset transistor coupled between an output of the inverting amplifier and the floating diffusion region.

13. The imaging pixel defined in claim 12, wherein the active reset circuit is configured to reset the floating diffusion region to a reference voltage.

14. The imaging pixel defined in claim 13, wherein the p-channel gain transistor is configured to amplify a signal from the floating diffusion region after the floating diffusion region is reset to the reference voltage.

15. The image sensor defined in claim 12, wherein the pixel further comprises a source follower transistor.

16. The image sensor defined in claim 15, wherein the source follower transistor is coupled to the floating diffusion region.

17. The image sensor defined in claim 16, wherein the pixel further comprises a pixel addressing transistor.

18. A system, comprising:
    a central processing unit;
    memory;
    a lens;
    input-output circuitry; and
    an imaging device, wherein the imaging device comprises:
        an array of pixels, each of which includes a floating diffusion region and an active reset circuit that includes an inverting amplifier, wherein the inverting amplifier comprises a p-channel gain transistor and an n-channel load transistor, and wherein the active reset circuit further comprises a reset transistor coupled between an output of the inverting amplifier and the floating diffusion region.

19. The system defined in claim 18, wherein each pixel of the array of pixels includes a source follower transistor.

20. The system defined in claim 19, wherein each pixel of the array of pixels includes a pixel addressing transistor.

* * * * *